United States Patent
Mulligan

(10) Patent No.: US 6,783,911 B2
(45) Date of Patent: Aug. 31, 2004

(54) ISOCYANATE CROSSLINKED IMAGEABLE COMPOSITIONS

(75) Inventor: James Mulligan, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 80 days.

(21) Appl. No.: 10/056,212

(22) Filed: Jan. 24, 2002

(65) Prior Publication Data

US 2003/0194635 A1 Oct. 16, 2003

(51) Int. Cl.$^7$ .................... G03F 7/023; G03F 7/30
(52) U.S. Cl. ................. 430/165; 190/191; 190/192; 190/193; 190/270.1; 190/326; 190/330
(58) Field of Search ................. 430/165, 190, 430/191, 192, 193, 270.1, 326, 330

(56) References Cited

U.S. PATENT DOCUMENTS

| 4,189,320 | A |   | 2/1980 | Hsieh .................... 430/145 |
| 4,579,806 | A | * | 4/1986 | Schupp et al. ............ 430/280.1 |
| 6,372,403 | B1 | * | 4/2002 | Kurisaki et al. ............ 430/191 |
| 6,596,150 | B2 | * | 7/2003 | Nishino et al. ............. 205/153 |

FOREIGN PATENT DOCUMENTS

| JP | 55045017 | 3/1980 |
| JP | 62164049 | 7/1987 |
| JP | 2000089451 | 3/2000 |
| JP | 2000-275834 | 10/2000 |
| WO | WO 95/12837 | 5/1995 |

* cited by examiner

Primary Examiner—John S. Chu
(74) Attorney, Agent, or Firm—Faegre & Benson LLP

(57) ABSTRACT

The present invention provides a positive working imageable composition, which includes a hydroxyfunctional resin comprising a covalently bound radiation sensitive group capable of increasing the solubility of the imageable composition in an alkaline developer upon exposure to radiation; and an isocyanate crosslinking agent. The present invention further provides an imageable element, which includes a substrate and an imageable composition according to the present invention coated on a surface of the substrate and a method of producing an imaged element according to the present invention. Also provided is a radiation sensitive hydroxyfunctional resin including a covalently bound radiation sensitive group capable of increasing solubility in an alkaline developer of an imageable composition derived therefrom upon exposure of the imageable composition to radiation.

40 Claims, No Drawings

ID SOCYANATE CROSSLINKED IMAGEABLE COMPOSITIONS

BACKGROUND OF THE INVENTION

1. Field of the Invention

The present invention relates to a positive working imageable composition, which includes a hydroxyfunctional resin having a covalently bound radiation sensitive group and an isocyanate crosslinking agent. More particularly, the present invention relates to a positive working imageable element, which includes a substrate and a positive working imageable composition according to the present invention, as well as a method of producing the imaged element.

2. Description of the Prior Art

Lithography is the process of printing from specially prepared surfaces, some areas of which are capable of accepting lithographic ink, whereas other areas, when moistened with water, will not accept the ink. In the art of photolithography, a photographic material is made imagewise receptive to oily inks in the photo-exposed (negative-working) or in the non-exposed areas (positive-working) on a hydrophilic background. The areas which accept ink form the printing image areas and the ink-rejecting areas form the background areas.

Lithographic printing plate precursors, i.e., imageable elements, typically include a radiation-sensitive coating applied over the hydrophilic surface of a support material. If after exposure to radiation, the exposed regions of the coating become soluble and are removed in the developing process, revealing the underlying hydrophilic surface of the support, the plate is called a positive-working printing plate. Conversely, if exposed regions become insoluble in the developer and the unexposed regions are removed by the developing process, the plate is called a negative-working plate. In each instance, the regions of the radiation-sensitive layer that remain (i.e., the image areas) are ink-receptive and the regions of the hydrophilic surface revealed by the developer are ink-repellent.

Upon imagewise exposure of the light-sensitive layer in a positive working system, the exposed image areas become soluble and the unexposed areas become insoluble. The plate is then developed with a suitable liquid to remove the photosensitive composition from the exposed areas.

Common difficulties encountered by practitioners of lithography include the poor solubility of the layer components in the solvents selected for the preparation of the coating solutions, insufficient differentiation between the image areas and the non-image areas, poor developability, undesirable scumming during printing, low practical light-sensitivity, poor adhesion of the imaging layer, low resistance to delamination under humid conditions, poor resistance to press chemicals and short press life.

U.S. Pat. No. 4,189,320 describes polymers derived from phenol formaldehyde novolak resin and organic isocyanates that are used in conventionally exposed positive working plates. While the adhesion of the coating to the support is improved, the image contrast and edge sharpness deteriorate during the developing process, particularly when the development is carried out using aggressive developers. The coating does not survive and is lost in the aggressive developer. There is no disclosure of a positive working imageable composition including a hydroxyfunctional resin that has a covalently bound radiation sensitive group. In addition, there is no disclosure of how to maintain the coating edges with little or no loss of the imageable composition under prolonged development in aggressive developers.

International Patent Application WO 9512837 discloses a photoreactive polymeric binder. The binder is derived from an isopropenyldimethyl benzyl isocyanate derivatised with hydroxyalkyl acrylate. The printing plate that uses this polymer exhibits improved runlength. The crosslinking in these systems is achieved by vinylic polymerization of the acrylic group, not by crosslinking of a hydroxyfunctional resin having a covalently bound radiation sensitive group with an isocyanate crosslinking agent.

Japanese Patent Document JP 55045017 describes a negative working printing plate containing a diazo resin and a resin binder with an isocyanate regenerator (stable at room temperature). After imaging and developing, the plate is baked crosslinked with the available resin. Coatings having enhanced runlengths are obtained. This patent document does not disclose positive working systems that have improved developer resistance of the unexposed coating to aggressive developers.

Japanese Patent Document JP 275834 discloses a composition having a blocked isocyanate group, an aqueous binder resin and an IR absorber. On thermal exposure, the isocyanate crosslinks with the binder resin. After development with water, a negative image results. This is a negatively working system. It does not disclose positive working systems that have improved developer resistance of the unexposed coating to aggressive developers.

Japanese Patent Document JP 62164049 discloses a thermal, negative working, non pre-heat plate system. There is no teaching of a negative working system that has an improved resistance to aggressive developers.

Japanese Patent Document JP 089451 discloses a thermally sensitive, positively working composition containing a phenolic resin, IR absorber and a multivalent isocyanate. There is no disclosure of an imageable composition which includes a hydroxyfunctional resin that has a covalently bound radiation sensitive group. In addition, there is no disclosure of resistance of the imageable composition aggressive developers under prolonged development conditions.

Thus, none of the above references discloses an imageable composition which includes a hydroxyfunctional resin that has a covalently bound radiation sensitive group and which is resistant to aggressive developers under prolonged development conditions.

Accordingly, it is an object of the present invention to provide an imagable composition, which includes an isocyanate crosslinking agent and a hydroxyfunctional resin having covalently bound radiation sensitive group.

It is another object of the present invention to provide an imagable composition, which is resistant to aggressive developers in the unexposed regions.

It is still another object of the present invention to provide an imagable composition, which enables coating edges to be maintained with little or no loss of material from the unexposed regions under prolonged development in aggressive developers.

The present invention provides such an imageable composition the unexposed regions of which are resistant to aggressive developers under prolonged development conditions.

SUMMARY OF THE INVENTION

The present invention provides a positive working imageable composition, including:

a hydroxyfunctional resin including a covalently bound radiation sensitive group capable of increasing the solubility of the imageable composition in an alkaline developer upon exposure to radiation; and an isocyanate crosslinking agent.

The present invention also provides an imageable element including:

a substrate; and a positive working imageable composition coated on a surface of the substrate, the composition including: a hydroxyfunctional resin including a covalently bound radiation sensitive group capable of increasing the solubility of the imageable composition in an alkaline developer upon exposure to radiation; and an isocyanate crosslinking agent.

The present invention further provides a method of producing an imaged element including the steps of:

providing an imageable element including a substrate and a positive working imageable composition coated on a surface of the substrate, the composition including: a hydroxyfunctional resin including a covalently bound radiation sensitive group capable of increasing the solubility of the imageable composition in an alkaline developer upon exposure to radiation; and a blocked or unblocked isocyanate crosslinking agent;

heating the imageable element at a temperature and length of time sufficient to produce a crosslinked imageable element;

imagewise exposing the crosslinked imageable element to produce an imagewise exposed element having exposed and unexposed regions; and contacting the imagewise exposed element and a developer to remove the unexposed regions and thereby produce the imaged element. This method can be used to prepare an imaged element according to the present invention.

The present invention still further provides a radiation sensitive hydroxyfunctional resin, which includes a covalently bound radiation sensitive group capable of increasing the solubility of a crosslinked imageable composition derived therefrom in an alkaline developer upon exposure of the crosslinked imageable composition to radiation.

The use of isocyanate crosslinked imageable composition of the present invention enables the coating edges to be maintained under prolonged development in aggressive developers with little or no loss of the unexposed imageable composition. In addition, the imageable element according to the present invention provides superior press life and chemical resistance to plate chemicals.

DETAILED DESCRIPTION OF THE INVENTION

Lithographic printing plate precursors, i.e., imageable elements, typically include a radiation imageable coating applied over a support material, such as, an aluminum substrate. If after exposure to radiation, the exposed regions of the coating become soluble and are removed in the developing process, revealing the underlying hydrophilic surface of the support, the plate is called a positive-working printing plate. Conversely, if exposed regions of the plate become insoluble in the developer and the unexposed regions are removed by the developing process, the plate is called a negative-working plate. In each instance, the regions of the radiation-sensitive layer that remain (i.e., the image areas) are ink-receptive and the regions of the hydrophilic surface revealed by the developing process accept water and repel ink.

To enable the coating edges to be maintained under prolonged development in aggressive developers with little or no loss of the unexposed imageable composition and to provide superior press life and chemical resistance to plate chemicals, the present invention provides a positive working imageable composition, which includes a hydroxyfunctional resin and an isocyanate crosslinking agent. The hydroxyfunctional resin includes a radiation sensitive group which is covalently bound to the resin. Upon crosslinking of the hydroxyfunctional resin that includes the covalently bound radiation sensitive group with an isocyanate crosslinking agent and subsequent exposure to radiation, the radiation sensitive group undergoes a chemical transformation, which increases the solubility of the exposed regions of the imageable composition in an alkaline developer solution. The unexposed regions remain unaffected.

The term "hydrocarbyl" in the context of the present invention refers to a linear, branched or cyclic alkyl, alkenyl, aryl, aralkyl or alkaryl of 1 to 22 carbon atoms, substituted derivatives thereof, wherein the substituent group is selected from halogen, hydroxy, hydrocarbyloxy, carboxyl, ester, ketone, cyano, amino, amido and nitro groups. Hydrocarbyl groups in which the carbon chain is interrupted by oxygen, nitrogen or sulfur are also included in the term "hydrocarbyl".

Preferably, the imagable composition of the present invention is radiation imageable, so that the imageable element according to the present invention can be imaged using ultraviolet radiation. Accordingly, in the method of the present invention, the step of imagewise exposing the imageable element to radiation is preferably carried out using an ultraviolet radiation. Upon such imaging the developer solubility of the imaged area is increased to allow differentiation between imaged and non-imaged areas upon development.

As described above, the hydroxyfunctional resin includes a covalently bound radiation sensitive group. The radiation sensitive group is capable of increasing the solubility of the imageable composition in an alkaline developer upon crosslinking an isocyanate crosslinking agent and exposure to radiation. Preferably, the radiation is ultraviolet radiation and the covalently bound radiation sensitive group is derived from an ultraviolet radiation sensitive compound. The ultraviolet radiation sensitive compound is preferably a compound represented by the formula:

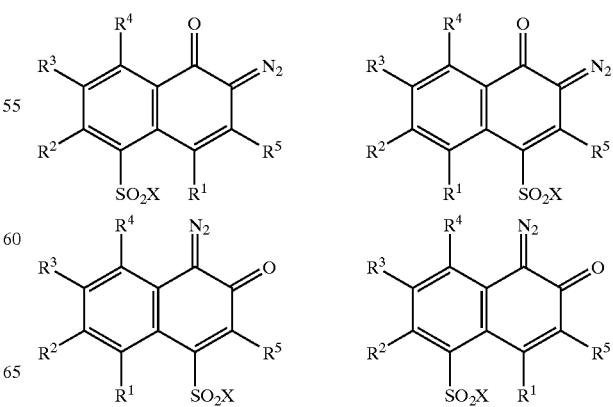

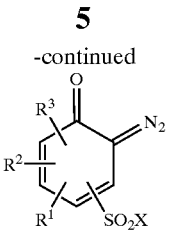

or a mixture thereof; wherein each of $R^1$, $R^2$, $R^3$, $R^4$ and $R^5$ can independently be hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester or cyano; and wherein x is halogen.

Examples of the ultraviolet radiation sensitive compounds include compounds represented by the following formulas:

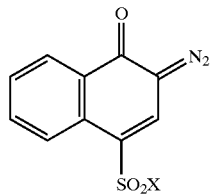 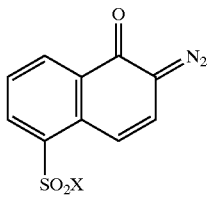

wherein x is chlorine.

The hydroxyfunctional resin, which has a covalently bound radiation sensitive group, is derived from a hydroxyfunctional resin, such as, a polyfunctional phenolic resin, an acrylic resin, a polyester resin, a polyurethane resin, a polyol or a combination thereof. Preferably, the polyfunctional phenolic resin can be a novolak resin, a pyrogallol/acetone resin, polyvinyl phenol polymer, vinyl phenol/hydrocarbyl acrylate copolymer, a resole resin or a mixture thereof. Examples of such resins include a phenol novolak resin, a cresol novolak resin, a phenol/cresol novolak resin, a resole resin or a mixture thereof.

The hydroxyfunctional resin, which includes a covalently bound radiation sensitive group, is prepared by a process including the steps of contacting in the presence of a base (i) a radiation sensitive compound represented by the formula:

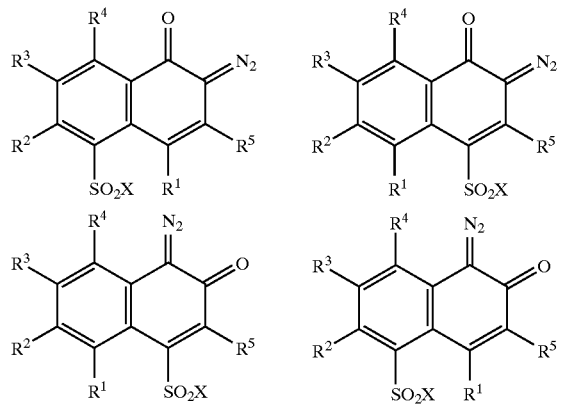

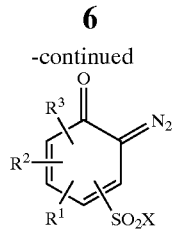

or a mixture thereof; wherein each of $R^1$, $R^2$, $R^3$, $R^4$ and $R^5$ can independently be hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester or cyano; and wherein x is halogen; and (ii) a hydroxyfunctional resin.

The hydroxyfunctional resin can be a polyfunctional phenolic resin, an acrylic resin, a polyester resin, a polyurethane resin, a polyol or a combination thereof and the contacting step is typically carried out under reaction conditions sufficient to produce a hydroxyfunctional resin, which has one or more covalently bound radiation sensitive groups.

The crosslinking agent can be any suitable crosslinking agent known in the art and includes crosslinking agents, such as, an isocyanate crosslinking agent, an amino resin crosslinking agent, an amido resin crosslinking agent, an epoxy compound having at least two epoxide groups and the like. A combination of the aforementioned crosslinkers can also be used.

The crosslinking agent preferably is an isocyanate crosslinking agent that has at least two, preferably more than two isocyanate groups. The term "isocyanate crosslinking agent" in the context of the present invention includes blocked and unblocked isocyanates. Such isocyanate crosslinkers include diisocyanates, such as, isophorone diisocyanate, methylene-bis-phenyl diisocyanate, toluene diisocyanate, hexamethylene diisocyanate, tetramethylxylylene diisocyanate, dimers thereof, adducts thereof with diols, adducts thereof with triols, adducts thereof with polyols, adducts thereof with polyesters, adducts thereof with acrylic resins, adducts thereof with polyurethane polyols, adducts thereof with isocyanate blocking agents and mixtures thereof.

Any suitable blocking agent can be used to block the isocyanate crosslinking agent. Preferably, the isocyanate blocking agent is a phenol, an oxime, a lactam or a pyrazole and includes isocyanate blocking agents, such as, a phenol, methyl ethyl ketone oxime, 2-pyrrolidone, 2-piperidone, caprolactam and 3,5-dimethylpyrazole. Examples of suitable blocked isocyanate crosslinking agents include Trixene BI 7950 (a 3,5-pyrazole blocked isophoronediisocyanate trimer) and Trixene BI 7960 (a 3,5 dimethyl pyrazole blocked N,N'-tris(6-isocyanatohexyl)imidocarbonic diimide), both available from Baxenden Chemicals, Lancashire, UK.

Preferably, the isocyanate crosslinking agent includes, on average, at least two free or blocked isocyanate groups and more preferably, from about two to about three free or blocked isocyanate groups per isocyanate crosslinking agent.

The imageable composition of the present invention can also include a colorant. In the context of the present invention, the term "colorant" includes colorant dyes and colorant pigments as well as a combination thereof.

Suitable colorant dyes include crystal violet, crystal violet lactone, ethyl violet, basonyl blue, victoria pure blue BO, victoria blue B, blue colorant dye, such as D11, which is dye victoria blue FBR represented by the formula:

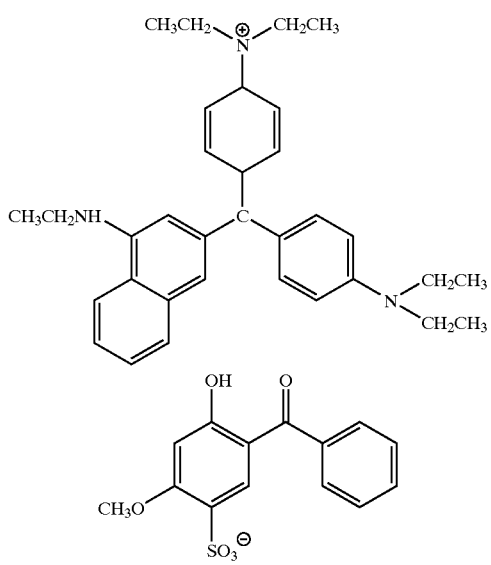

and mixtures thereof.

The imageable element according to the present invention can further contain dyestuffs and/or pigments, such as those mentioned in U.S. Pat. Nos. 3,218,167 and 3,884,693, which can serve to increase the contrast and also to harden the layer.

The imageable composition of the present invention can also include an acid generator, which is preferably a thermal or ultraviolet radiation activated compound. Upon exposure to, for example, ultraviolet radiation, the acid generator produces a free acid, which acts as a catalyst for color generation.

Suitable acid generators include a light sensitive triazine compounds, onium salts, diazonium salts, covalently bound sulfonate group containing compounds, hydrocarbylsulfonamido-N-hydrocarbyl sulfonate and a combination thereof.

Examples of such light sensitive triazine acid generators include compounds represented by the formula:

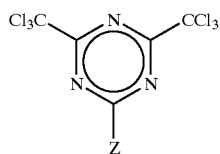

wherein Z can be hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester, cyano, a group represented by the formula:

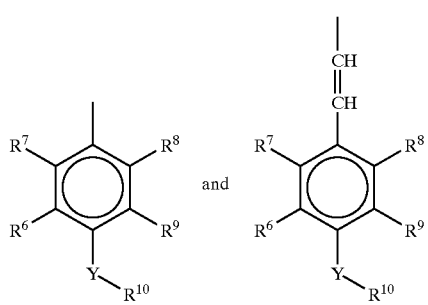

wherein each of $R^6$, $R^7$, $R^8$ and $R^9$ can be hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester or cyano, wherein $R^6$ and $R^7$ and/or $R^8$ and $R^9$ together can form a cycloaliphatic, benzo or a substituted benzo ring;

wherein $R^{10}$ can be a linear, branched or cyclic alkyl of 1 to 22 carbon atoms, aralkyl of 6 to 22 carbon atoms, aryl, alkaryl, haloalkyl, acyl, ester or cyano; and wherein Y is a heteroatom, which can be oxygen or sulfur.

Preferably, the light sensitive triazine compound is represented by the formula:

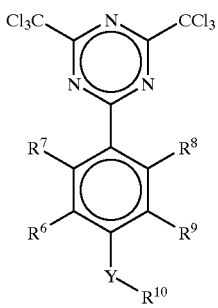

wherein each of $R^6$, $R^7$, $R^8$ and $R^9$ can independently be hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester or cyano, wherein $R^6$ and $R^7$ and/or $R^8$ and $R^9$ together can form a cycloaliphatic, benzo or a substituted benzo ring;

wherein $R^{10}$ can be a linear, branched or cyclic alkyl of 1 to 22 carbon atoms, aralkyl of 6 to 22 carbon atoms, aryl, alkaryl, haloalkyl, acyl, ester or cyano; and wherein Y is a heteroatom, which can be oxygen or sulfur.

Examples of such light sensitive triazine compound include compounds represented by the following formulas:

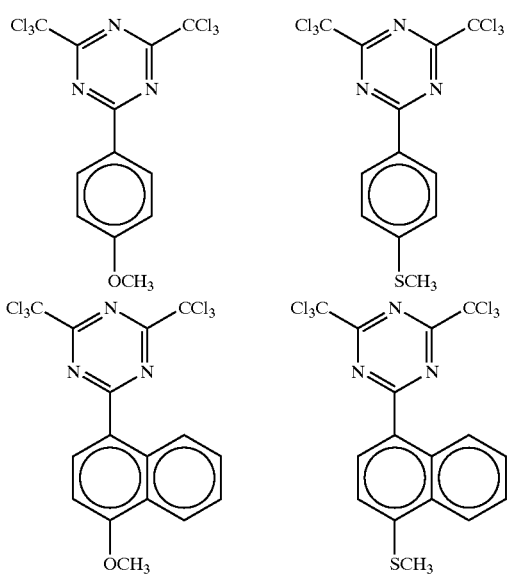

and a mixture thereof.

Examples of the covalently bound sulfonate group containing compounds that are suitable for use as an acid generator include hydrocarbyl sulfonates, such as, methyl tosylate, ethyl tosylate, benzoin tosylate, and the like.

An acid generator can also be a salt. Such acid generators can have any counter anion. However, acid generators having a counter anion derived from a non-volatile acid are preferred. In such acid generator systems that have a counter anion derived from a non-volatile acid, the counter anion can combine with protons to produce a non volatile acid. Unlike volatile acids, such non-volatile acids remain in the imageable composition thereby increasing the speed of color development of the colorant.

The term "volatile acid" in the context of the present invention refers to hydrogen halides such as HF, HCl, HBr and HI, which can escape from the imageable composition during imaging and/or baking steps. The term "non-volatile acid" in the context of the present invention refers to any non-halogen acid.

The acid generator can be an onium salt that has a non-nucleophilic counter anion derived from a non-volatile acid, such as, sulfate, bisulfate, tetrafluoroborate, hexafluorophosphate, hexafluoroarsenate, hexafluoroantimonate, tetrakis(pentafluorophenyl)-borate, triflate, pentafluoropropionate, pentafluoroethanesulfonate, benzenesulfonate, p-methylbenzenesulfonate and pentafluorobenzene-sulfonate.

Examples of such onium salts include iodonium salts, sulfonium salts, hydrocarbyloxysulfonium salts, hydrocarbyloxyammonium salts, aryl diazonium salts and combinations thereof. Examples of the hydrocarbyloxy ammonium salts include the salts of N-hydrocarbyloxy substituted nitrogen containing heterocyclic compounds, such as, N-ethoxyisoquinolinium hexafluorophosphate. Examples of the iodonium salts include 4-octyloxyphenyl phenyliodonium hexafluoroantimonate.

The acid generator can also be a monomeric or oligomeric aromatic diazonium salt. The monomeric and oligomeric diazonium salts can be any diazonium salt known in the art that is suitable for use in thermal imaging, provided that the diazonium salt has a counter anion that is other than halide.

Examples of such counter anions include sulfate, bisulfate, tetrafluoroborate, hexafluorophosphate, hexafluoroarsenate, hexafluoroantimonate, tetrakis (pentafluorophenyl)borate, triflate, pentafluoropropionate, pentafluoroethanesulfonate, benzenesulfonate, p-methylbenzene sulfonate and pentafluorobenzene-sulfonate. Preferably, such diazonium salts are aromatic and more preferably, are derivatives of diphenylamine-4-diazonium salts, including, for example, for example, 4-diazodiphenylamine sulfate. Examples of such aromatic diazonium salts include: diphenyl-4-diazonium sulfate; 2-4-(N-(naphthyl-2-methyl)-N-propylamino)-benzenediazonium sulfate; chloro-diphenyl-4-diazonium sulfate; 4-(3-phenylpropylamino)-benzenediazonium sulfate; 4-(N-ethyl-N-(benzyl)-amino)-benzenediazonium sulfate; 4-(N,N-dimethyl-amino)-benzenediazonium tetrafluoroborate; 4-(N-(3-phenyl-mercapto-propyl)-N-ethyl-amino)-2-chlorobenzenediazonium sulfate; 4-(4-methylphenoxy)-benzenediazonium sulfate; 4-(phenylmercapto)-benzenediazonium sulfate; 4-phenoxybenzenediazonium sulfate; 4-(benzoylamino)-benzenediazonium hexafluorophosphate; methylcarbazole-3-diazonium sulfate; 3-methyl-diphenyleneoxide-2-diazonium sulfate, 3-methyldiphenylamine-4-diazonium sulfate, 2, 3',5-trimethoxydiphenyl-4-diazonium sulfate; 2,4',5-triethoxydiphenyl-4-diazonium sulfate; 4-(3-(3-methoxyphenyl)-propylamino)-benzenediazonium sulfate; 4-(N-ethyl-N-(4-methoxybenzyl)-amino)-benzenediazonium sulfate; 4-(N-(naphthyl-(2)-methyl)-N-n-propylamino)methoxybenzenediazonium sulfate; 4-(N-(3-phenoxypropyl)-N-methylamino)-2,5-dimethoxybenzenediazonium tetrafluoroborate; 4-(N-(3-phenylmercaptopropyl)-N-ethylamino)-2-chloro-5-methoxybenzenediazonium sulfate; 4-(4-(3-methylphenoxy)-phenoxy)-2,5-dimethoxybenzenediazonium sulfate; 4-(4-methoxy-phenylmercapto)-2,5-diethoxybenzenediazonium sulfate; 2,5-diethoxy-4-phenoxybenzenediazonium sulfate; 4-(3,5-dimethoxybenzoylamino)-2,5-diethoxybenzenediazonium hexafluorophosphate; methoxycarbazole-3-diazonium sulfate; 3-methoxy-diphenyleneoxide-2-diazonium sulfate and methoxydiphenylamine-4-diazonium sulfate.

Diazonium salts derived from the following amines are also suitable for use in the present invention: 4-amino-3-methoxydiphenylamine, 4-amino-2-methoxydiphenylamine, 4'-amino-2-methoxydiphenylamine, 4'-amino-4-methoxydiphenylamine, 4-amino-3-ethoxydiphenylamine, 4-amino-3-hexyloxydiphenylamine, 4-amino-3-beta-hydroxyethoxy-diphenylamine, 4'-amino-2-methoxy-5-methyldiphenylamine, 4-amino-3-methoxy-6-methyldiphenylamine, 4'-amino-4-n-butoxydiphenylamine, 4'-amino-3',4-dimethoxydiphenylamine, 4-amino-diphenylamine, 4-amino-3-methyl-diphenylamine, 4-amino-3-methyldiphenylamine, 4'-amino-3-methyl-diphenylamine, 4'-amino-4-methyl-diphenylamine, 4'-amino-3,3'-dimethyldiphenylamine, 3'-chloro-4-amino-diphenylamine, 4-aminodiphenylamine-2-sulfonic acid, 4-aminodiphenylamine-2-carboxylic acid, 4-aminodiphenylamine-2'-carboxylic acid and 4'-bromo-4-aminodiphenylamine. Preferred are 4-aminodiphenylamine, 3-methyl-4-aminodiphenylamine, 3-alkoxy-4-aminodiphenylamines having 1 to 3 carbon atoms in the alkoxy group and 3-methoxy-4-aminodiphenylamine.

Examples of the particularly preferred monomeric aromatic diazonium salts include 2-methoxy-4-phenylaminobenzenediazonium hexafluorophosphate (diazo MSPF6) represented by the formula:

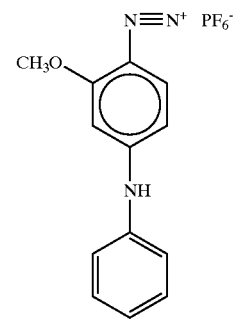

2-methoxy-4-phenylaminobenzenediazonium p-toluenesulfonate represented by the formula:

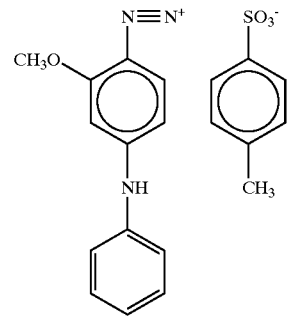

and a combination thereof.

Examples of the particularly preferred oligomeric aromatic diazonium salts include compounds represented by the formula:

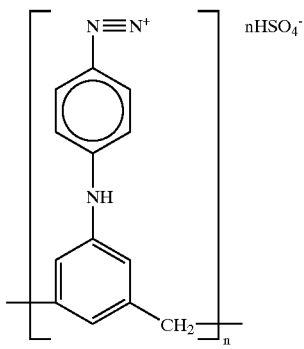

which is manufactured by St. Jean Photochemicals, Quebec, Canada, under the trade name DTS-18;

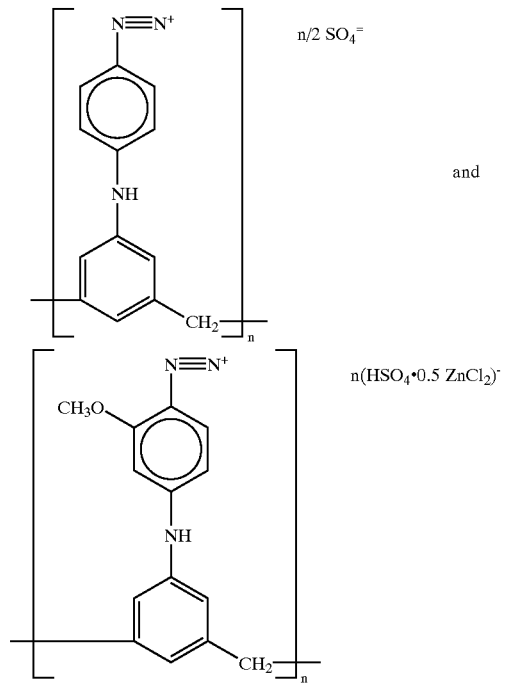

and wherein n is from 1 to 11; and a combination thereof.

Mixtures of any of the aforementioned diazonium salts are also suitable. A person of ordinary skill in the art would know how to use other aromatic diazonium salts that are suitable for use in the imagable composition of the present invention.

The present invention also provides an imageable element, which employs the imageable composition of the present invention. The imageable element includes a substrate and an imageable composition according to the present invention coated on a surface of the substrate. Preferably, the positive working imageable composition is crosslinked.

The substrate of the imageable element is typically an aluminum sheet. However, other materials that are commonly known to those skilled in the art can also be used.

Suitable substrates include any sheet material conventionally used to prepare lithographic printing plates, including metals such as aluminum sheets; paper; paper coated on one or both sides with an alpha-olefin polymer such as polyethylene; acetate films such as polyvinyl acetate and cellulose acetate film; polyvinyl acetal film; polystyrene film; polypropylene film; polyester film such as polyethylene terephthalate film; polyamide film; polyimide film; nitrocellulose film; polycarbonate film; polyvinylchloride film; composite films such as polyester, polypropylene or polystyrene film coated with polyethylene film; metalized paper or films; metal/paper laminates; Perlon gauze; plates of magnesium, zinc, copper, anodized aluminum, electrochemically roughened aluminum, steel, and the like. The surfaces of the substrate can be subjected to a pretreatment, if necessary, using the surface treatment techniques known in the art to improve adhesion between the substrate and organic coatings.

A preferred substrate for the imageable element of present invention is an aluminum sheet. The preferred aluminum substrate is electrochemically-grained and anodized aluminum, such as commonly used for lithographic printing plates. Anodized substrates can be prepared using sulfuric acid anodization, phosphoric acid anodization or a combination thereof. Other conventional anodization methods can also be used in the preparation of the anodized substrate of the present invention. Graining (or roughening) can be accomplished by mechanical or electrochemical processes or by a combination of both processes. The surface of the aluminum sheet may be treated with metal finishing techniques known in the art including physical roughening, electrochemical roughening, chemical roughening, anodizing, and silicate sealing and the like. If the surface is roughened, the average roughness (Ra) is preferably in the range from 0.1 to 0.8 μm, and more preferably in the range from about 0.1 to about 0.4 μm. The preferred thickness of the aluminum sheet is in the range from about 0.005 inch to about 0.020 inch.

Post-treatment with phosphate or phosphate/fluoride, followed by silication, can also be used. Preferred post-treatments include silication and polyvinyl phosphonic acid.

The base sheet substrate may serve as the final support, or it may be an intermediate support from which the light-sensitive copying composition may be transferred, by lamination, onto the material to be processed.

The imageable layer can be applied using the application methods known in the art. For example, the components of the imageable composition can be dissolved in solvents, preferably organic solvents, and applied to an aluminum substrate, which has been preferably grained, anodized and post-treated.

The plate precursor is then heated at a temperature from about 80° C. to about 160° C., preferably from about 110° C. to about 140° C. for a period of time from about 45 seconds to about 120 seconds, preferably from about 60 seconds to about 100 seconds to crosslink the hydroxyfunctional resin, which includes a covalently bound radiation sensitive group, with the isocyanate crosslinking agent. After proper drying, the coating weight of the imaging layer preferably is in the range of about 0.2 to about 5.0 g/m$^2$, and more preferably in the range from about 0.7 to about 2.5 g/m$^2$.

Upon exposure to ultraviolet radiation, the exposed plate precursor is developed with a developer capable of selectively removing the materials in the exposed regions.

The imageable element of the present invention is suitable for use in single as well as multilayer imageable elements that are useful in lithographic printing, including lithographic printing plates that can be thermally imaged by imagewise exposure with a laser or a thermal printing head.

The multilayer imageable element is useful as a precursor for a lithographic printing member.

In addition to the imageable layer, the imageable element can have additional layers, such as, an underlying layer. Possible functions of an underlying layer include enhancing developability of the imagewise unexposed areas and acting as a thermal insulating layer for the imagewise exposed areas. In accordance with these functions, the underlying layer should be soluble or at least dispersible in the developer and, preferably, have a relatively low thermal conductivity coefficient.

The imageable element can further have an overlying layer. Possible functions of an overlying layer include prevent damage, such as scratching, of the surface layer during handling prior to imagewise exposure; and preventing damage to the surface of the imagewise exposed areas, for example, by over-exposure, which could result in partial ablation. The overlying layer should be soluble, dispersible or at least permeable to the developer.

In a multilayer thermally imageable case, the element has a bottom layer including a polymeric material which can be removed by treatment with an aqueous alkaline solution, and a top layer having the imageable layer of the present invention which upon imaging exhibits a increased solubility of the exposed regions in an aqueous developer solution, i.e., is positive working.

Further, known plasticizers, adhesion promoters, flow control agents and/or UV absorbers can be added to the copying compositions of the invention. The type and quantity of such additives depend on the purpose for which the imageable element according to the present invention is intended for use. In any case, however, care must be taken that the substances added do not absorb an excessive proportion of the radiation required for acid generation and thus reduce the imaging sensitivity of the composition.

Suitable plasticizers include dibutyl phthalate, dioctyl phthalate, diisooctyladipate, nitro esters, alkyl and aryl phosphate esters, chlorinated paraffins. Glycols or aliphatic polyols can also be added. If it is desired to ensure good storability under relative high atmospheric moisture conditions, the use of water-insoluble plasticizers is preferred.

Adhesion promoters can also be added. Suitable adhesion promoters include monomeric or polymeric organic silanes, nitrogen-containing heterocyclic compounds, such as those disclosed in U.S. Pat. Nos. 3,645,722, 3,622,234, and 3,827,908, heterocyclic mercaptan compounds, mercapto alkanoic acid anilides and mercapto alkanoic acid esters.

The present invention also provides a method of producing an imaged element, which includes the steps of:
  providing an imageable element including a substrate and a positive working imageable composition coated on a surface of the substrate, the composition including: a hydroxyfunctional resin including a covalently bound radiation sensitive group capable of increasing the solubility of the imageable composition in an alkaline developer upon exposure to radiation and an isocyanate crosslinking agent;
  heating the imageable element at a temperature and length of time sufficient to produce a crosslinked imageable element;
  imagewise exposing the imageable element to radiation to produce an imagewise exposed element having exposed and unexposed regions; and
  contacting the imagewise exposed element and a developer to remove the exposed regions and thereby produce the imaged element, The method can be practiced by imagewise exposing the imageable element to ultraviolet radiation. The exposing step of this method is preferably carried out using any suitable ultraviolet radiation source known in the art. The printing plates, forms, screens, resists and the like, are prepared in the customary manner from the appropriate materials.

The imageable element of the present invention is positive working. Preferably, the imageable element according to the present invention is ultraviolet radiation imageable. Accordingly, in the method of the present invention, the step of imagewise exposing the imageable element to radiation is carried out using ultraviolet radiation. Upon such imaging the developer solubility of the imaged area is increased to allow differentiation between imaged and non-imaged areas upon development.

Typically, the step of exposing the imageable element to ultraviolet radiation is carried out using a UV radiation source, such as a metal halide doped mercury lamp. Such radiation sources typically emit radiation in both the UV and visible spectral regions. Lasers as well as excimer lamps, having appropriate emission that overlaps with absorption of the diazonium salt compositions, may also be used.

Following imagewise exposure by analog or digital means, an imaged element having exposed areas and complimentary unexposed areas is obtained. After exposure, the image areas of the layer, which have become more soluble, are removed by treatment with a suitable developer, such as, an aqueous acid or base solution.

The developer composition is dependent on the nature of the polymeric substance, but is preferably an aqueous composition. Common components of aqueous developers include surfactants, chelating agents, such as, salts of ethylenediamine tetraacetic acid, organic solvents, such as, benzyl alcohol, ethylene glycol monomethyl ether, ethylene glycol monoethyl ether, diacetone alcohol, butyl acetate, ethylene glycol methyl ether acetate, methyl isobutyl ketone and a mixture thereof, and alkaline components, such as organic amines, including alkanol amines, such as triethanol amine and methyl diethanol amine, inorganic metasilicates, organic metasilicates, hydroxides and bicarbonates.

The pH of the aqueous developer is preferably within about 5 to about 14, depending on the nature of the composition of the imaging layer. The development can be performed by any known manner, for instance, by rubbing the plate surface with a developing pad containing the foregoing developer or by pouring the developer on the plate surface and then rubbing the surface with a developing brush in water.

As described above, the positive working imageable composition can further include a colorant and an acid generator and, as before, the exposing step is preferably carried out using ultraviolet radiation.

The present invention further includes a radiation sensitive hydroxyfunctional resin having a covalently bound radiation sensitive group such as those described above. Upon exposure to ultraviolet radiation, the covalently bound radiation sensitive group increases the solubility of the crosslinked imageable composition in an alkaline developer.

The radiation sensitive hydroxyfunctional resin is prepared by a process, which includes contacting in the presence of a base:
  (i) a radiation sensitive compound selected from the group consisting of compounds represented by the formula:

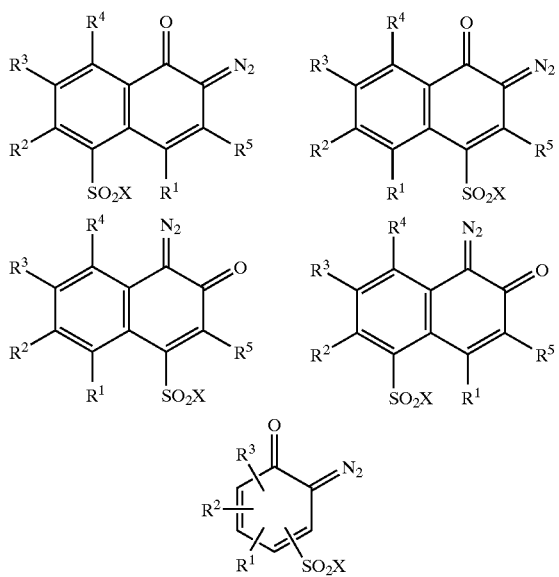

and a mixture thereof; wherein each of $R^1$, $R^2$, $R^3$, $R^4$ and $R^5$ is independently selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester and cyano; and wherein x is halogen; and (ii) a hydroxyfunctional resin free of radiation sensitive groups, wherein the contacting step is carried out under reaction conditions sufficient to produce the radiation sensitive hydroxyfunctional resin.

Preferably, the contacting step is carried out in an aqueous medium containing a solvent, such as, 2-methoxy-ethanol under slightly basic conditions (i.e., sodium bicarbonate) by slow addition of a radiation sensitive compound, such as, a diazoquinonesulphonyl halide, to a hydroxyfunctional resin, which is free of radiation sensitive groups, with vigorous stirring, for example, at about 40° C. for about 6 hr.

As described above, the hydroxyfunctional resin that is free of radiation sensitive group is selected from a polyfunctional phenolic resin, acrylic resin, polyester resin, polyurethane resin and a polyol. Mixtures thereof can also be used.

The use of isocyanate crosslinked imageable composition of the present invention enables the coating edges to be maintained under prolonged development in aggressive developers with little or no loss of the unexposed imageable composition. In addition, the imageable element according to the present invention provides superior press life and chemical resistance to plate chemicals.

The imageable element according to the present invention is characterized by a high practical light-sensitivity, good differentiation between image areas and non-image areas, high resolution, easy, scum-free development involving no environmental hazards, long printing runs, and good compatibility of the components of the imaging layer in the solvents selected for coating.

The present invention is further described in the following examples, which are intended to be illustrative and not limiting.

EXAMPLES

The following are referred to hereinafter:

Resin A: the resin produced when 2,1,4-naphthoquinone diazide chloride (18 g) was reacted with Ib6564 (50 g, a phenol/cresol novolak resin supplied by Bakelite) and Ib744 (50 g, a cresol Novolak from Bakelite), under a typical esterification route.

Resin B: Posylux 2521, a 2,1,5-NQD pyrogallol acetone resin as supplied by PCAS, Longmujeau, France.

Resin C: PD646A, a cresylic novolak resin as supplied by Borden Chemicals of Louisville, Ky.

Resin D: N13, a novolak resin as supplied by Eastman Kodak.

Resin E: IH1225, a phenol novolak resin as supplied by Kodak Polychrome Graphics, Japan.

Blue Dye A: Crystal violet (Basic Violet 3) as supplied by Ultra Colours and Chemicals of Cheadle Hulme, Cheshire, UK.

Isocyanate A: Trixene BI 7950, as supplied by Baxenden Chemicals, Baxenden, Nr Accrington, Lancashire, UK.

Isocyanate B: Trixene BI 7960, as supplied by Baxenden.

Triazine 1 and 2: both supplied by PCAS:

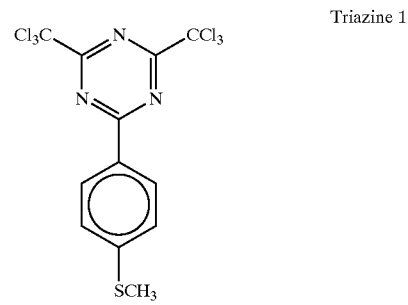

Triazine 1

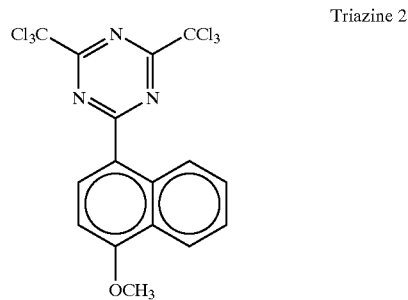

Triazine 2

Substrate: 0.3 mm thick sheets of aluminum that had been electrograined, anodised and post-anodically treated with an aqueous solution of an inorganic phosphate.

Combifix XL supplied by Stehlin and Hostag Inks, Nottingham, UK

Substifix HD supplied by Stehlin and Hostag.

Preparation of O-diazonaphthoguinone Containing Binder: General Procedure

Distilled water (102.4 g) was added slowly to NOVOLAK resin (100 g) dissolved in 2-methoxy-ethanol (247.2 g) with stirring to prevent precipitation. Then, sodium bicarbonate (17.2 g) was added. Then, a diazonaphthoquinonesulphonyl halide, such as, 2-diazo-1-naphthoquinone-4-sulphonyl chloride (18 g), was added slowly with vigorous stirring and the reaction mixture was heated at 40° C. with continued stirring for 6 hr. The reaction mixture was allowed to cool and the o-diazonaphthoquinone containing binder was precipitated by the addition of a solution containing about 34.4 g concentrated hydrochloric acid in about 1416 g of distilled water. The binder was filtered off, re-slurried with distilled water three times and filtered and dried in a vacuum oven at 40° C. to give the title o-diazonaphthoquinone containing binder.

Examples C1, 1 and 2

Coating formulations included solutions of the components described in table 1 in 1-methoxypropan-2-ol/2-methoxyethyl acetate (98:2, v:v). Plates were prepared by coating the formulations onto the aluminum substrate by means of a wire wound bar.

The formulation concentrations were selected to provide dry films having a coating weight of 2.0 gm$^{-2}$. The film weights were measured after thorough drying at 130° C. for 80 seconds. The plate samples were left overnight, before proceeding to test them.

TABLE 1

| | Example | | |
|---|---|---|---|
| | C1 | 1 | 2 |
| Component | Parts by Weight | | |
| Resin A | 99.5 | 94.8 | 94.8 |
| Isocyanate A | | 4.7 | |
| Isocyanate B | | | 4.7 |
| Blue Dye A | 0.1 | 0.1 | 0.1 |
| Triazine 1 | 0.4 | 0.4 | 0.4 |

The resistance of the coatings to developer was assessed. A drop of the relevant developer at 20° C. was placed on each coating and the time taken to notice "significant deterioration" was measured. Goldstar is a premium positive plate developer (marketed by Kodak Polychrome Graphics, Norwalk, Conn.), having a powerful developing action but is not considered aggressive. EP260 is a positive plate developer (marketed by Agfa), and is considered aggressive.

TABLE 2

| Example and relevant developer | Time to notice significant deterioration/seconds |
|---|---|
| C1 and Goldstar | >240 |
| C1 and Ep260 | 30 |
| 1 and Goldstar | >240 |
| 1 and EP260 | 120 |
| 2 and Goldstar | >240 |
| 2 and EP260 | 180 |

Examples C2, C3 and 3 to 6

Coating formulations included solutions of the components as described in table 3 in 1-methoxypropan-2-ol. Preparation was as described above.

TABLE 3

| | Example | | | | | |
|---|---|---|---|---|---|---|
| | C2 | C3 | 3 | 4 | 5 | 6 |
| Component | Parts by Weight | | | | | |
| Resin B | 27.4 | 21.5 | 24.0 | 27.4 | 21.5 | 27.4 |
| Resin C | 70.4 | 6.8 | 30.0 | 54.8 | 68.5 | 20.5 |
| Resin D | | 69.5 | 30.0 | | | 20.5 |
| Resin E | | | 7.8 | 7.8 | | 14.7 |

TABLE 3-continued

| | Example | | | | | |
|---|---|---|---|---|---|---|
| | C2 | C3 | 3 | 4 | 5 | 6 |
| Component | Parts by Weight | | | | | |
| Isocyanate A | | | 6.0 | 7.8 | 7.8 | 14.7 |
| Blue Dye A | 1.2 | 1.2 | 1.2 | 1.2 | 1.2 | 1.2 |
| Triazine 2 | 1.0 | 1.0 | 1.0 | 1.0 | 1.0 | 1.0 |

The resistance of a coating to developer was assessed using a weight loss method. A known area of coated plate sample is cut and weighed (measurement A). The sample is then immersed in the relevant developer for 120 seconds, at 25° C. After submersing, the plates are rinsed with water and then rubbed with cotton wool. After drying the sample is re-weighed (measurement B). Subtraction of B from A, gives the amount of coating remaining on the plate of known area, after development. From this figure a percentage weight loss can be calculated. The developers used were Goldstar and EP260. The error on the test is estimated to be +/−6%.

TABLE 4

| Example and relevant developer | Weight Loss (Percent) |
|---|---|
| C2 and Goldstar | 15 |
| C2 and Ep260 | 100 |
| C3 and Goldstar | 16 |
| C3 and EP260 | 100 |
| 3 and Goldstar | 0 |
| 3 and EP260 | 4 |
| 4 and Goldstar | 9 |
| 4 and EP260 | 6 |
| 5 and Goldstar | 1 |
| 5 and EP260 | 0 |
| 6 and Goldstar | 6 |
| 6 and EP260 | 0 |

Example 7

A coating formulation including a solution of the components as described in table 5 in 1-methoxypropan-2-ol was assembled. Preparation was as described above.

TABLE 5

| Components | Example 7 Parts by Weight |
|---|---|
| Resin B | 27.4 |
| Resin C | 54.8 |
| Resin E | 7.8 |
| Isocyanate A | 7.8 |
| Blue Dye A | 1.2 |
| Triazine 2 | 1.0 |

The performance of the plate sample was tested in a number of ways:
(a) The resistance of the coating to developer was assessed using a weight loss method as described above in Goldstar and EP260.
(b) The sensitivity of the plate was assessed by measuring the amount of radiation required to clear the third step of a Stouffer Wedge after fixed developing conditions. The UV radiation was supplied by a Montakopf light-frame. The developer used was Goldstar at 20° C. for 60 seconds employing hand development.

(c) The resistance of the sample to differing founts, one with a high level, and one with a reduced level (see compositions 1 and 2).

| Composition 1 | Composition 2 |
|---|---|
| 16.8 wt % Isopropyl alcohol | 5 wt % isopropyl alcohol |
| 4.4 wt % Combifix XL | 24 wt % Substifix HD |
| 78.8 wt % water | 71 wt % water |

Test plates, roughly 5×12 cm, are fogged sequentially from a level of radiation equal to one tenth the "clear 3" sensitivity reading up to the full "clear 3" radiation level. The increments of increase in the fogging are one tenth on the "clear 3", consequently there are 11 strips on the plate, one un-fogged and 10 fogged. After fogging the plates are submersed in one of the founts solutions held at 25° C., for a set time, (1 hour for composition 1, 0.5 hours for composition 2). After washing and drying the strips, the test plates are subjected to a tape test with a Tesa tape 4122 (50 mm).

The plates are assessed by stating how many of the fogged strips still have light sensitive coating fully intact. This indicates the degree of fogging that causes failure of the plate once it has been immersed in fount solution and tape tested, e.g., if 4 strips are intact then fogging of 0.3× clear 3 sensitivity radiation units will not result in plate failure but 0.4× clear 3 units will.

(d) "Wash resistance"—In this test plates are submersed in the test solutions below and is rubbed with a plate print roller cleaning cloth at the intervals in table 6. The rating of a plate is calculated using the time it takes for appreciable deterioration of plate coating, and the solution used, see table 6. The rating given to a plate is that at which the plate fails initially.

Tests with solution 2 are performed only when solution 1 fails to cause deterioration in the plate coating. A rating of 10 is given to plates that do not fail after 240 s submersion in solution 2.

Wash resistance solutions are shown below:

|  | Solution 1 (wt %) | Solution 2 (wt %) |
|---|---|---|
| Isopropyl Alcohol | 15 | 20 |
| Petroleum Ether SBP 140/165 | 84.5 | 79 |
| Demineralised water | 0.5 | 1 |

TABLE 6

|  | Ratings at a Given Time of Rub | | | | |
|---|---|---|---|---|---|
| Time of Rub (sec.) | 30 | 60 | 120 | 180 | 240 |
| Solution 1 | 0 | 1 | 2 | 3 | 4 |
| Solution 2 | 5 | 6 | 7 | 8 | 9 |

(e) Printout—The printout of the plates was tested using a Macbeth model RD 918 densitometer. The measured values show the difference in optical density of unexposed plates and plates exposed to a "clear 3" level of radiation. The results are summarized in table 7.

TABLE 7

| Test | Example 7 Result |
|---|---|
| Coating weight loss in Goldstar | 9% |
| Coating weight loss in Goldstar-repeat | 9% |
| Coating weight loss in EP260 | 6% |
| Coating weight loss in EP260-repeat | 11% |
| Plate speed, amount of light units required for clear 3 on Stouffer wedge | 318 |
| Plate speed, amount of light units required for clear 3 on Stouffer wedge-repeat | 338 |
| Coating weight loss under the "wet adhesion test" using composition 1 | 10 |
| Coating weight loss under the "wet adhesion test" using composition 1-repeat | 9 |
| Coating weight loss under the "wet adhesion test" using composition 2 | 9 |
| Coating weight loss under the "wet adhesion test" using composition 2-repeat | 9 |
| Wash resistance rating | 1 |
| Wash resistance rating | 3 |
| Printout | 0.10 |
| Printout-repeat | 0.11 |

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A positive working imageable composition, comprising:
   a hydroxyfunctional resin comprising a covalently bound radiation sensitive group capable of increasing the solubility of said imageable composition in an alkaline developer upon exposure to radiation;
   an acid generator;
   a colorant; and
   an isocyanate crosslinking agent.

2. The imageable composition of claim 1, wherein said covalently bound radiation sensitive group is sensitive to ultraviolet radiation.

3. The imageable composition of claim 1, wherein said radiation sensitive group is a moiety selected from the group consisting of:

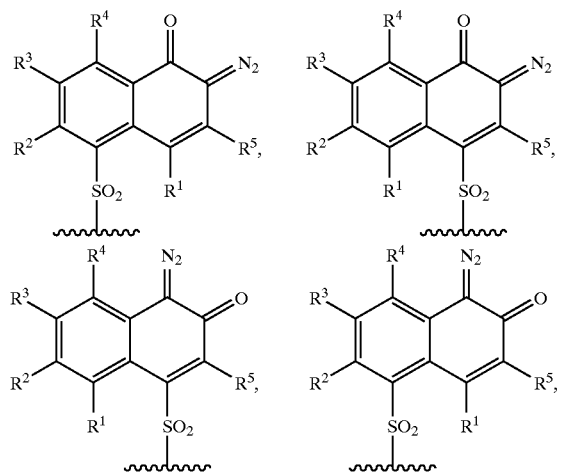

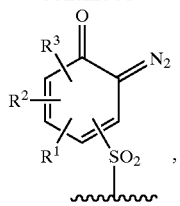

and a mixture thereof;

wherein each of $R^1$, $R^2$, $R^3$, $R^4$ and $R^5$ is independently selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester and cyano.

4. The imageable composition of claim 1, wherein said radiation sensitive group is a moiety selected from:

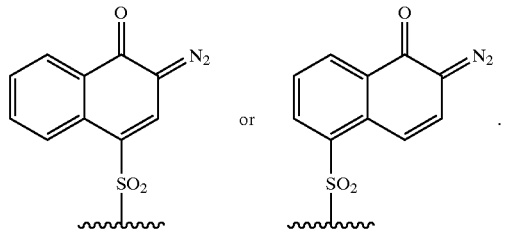

5. The imageable composition of claim 1, wherein said hydroxyfunctional resin includes a resin moiety derived from a polyfunctional resin selected from the group consisting of: a novolak resin, a pyrogallol/acetone resin, polyvinyl phenol polymer, vinyl phenol/hydrocarbyl acrylate copolymer, a resole resin, an acrylic resin, a polyester resin, a polyurethane resin, a polyol and a mixture thereof.

6. The imageable composition of claim 5, wherein said polyfunctional resin is a phenol novolak resin, a cresol novolak resin, a phenol/cresol novolak resin, a resole resin or a mixture thereof.

7. The imageable composition of claim 1, wherein said isocyanate crosslinking agent is selected from the group consisting of: isophorone diisocyanate, methylene-bisphenyl diisocyanate, toluene diisocyanate, hexamethylene diisacyanate, tetramethylxylylene diisocyanate, dimers thereof, adducts thereof with diols, adducts thereof with triols, adducts thereof with polyols, adducts thereof with polyesters, adducts thereof with acrylic resins, adducts thereof with polyurethane polyols, adducts thereof with an isocyanate blocking agent and mixtures thereof.

8. The imageable composition of claim 1, wherein said isocyanate crosslinking agent comprises a blocking agent selected from the group consisting of: a phenol, an oxime, a lactam and a pyrazole.

9. The imageable composition of claim 1, wherein said isocyanate crosslinking agent comprises a blocking agent selected from phenol, methyl ethyl ketone oxime, 2-pyrrolidone, 2-piperidone, caprolactam or 3,5-dimethylpyrazole.

10. The composition of claim 1, wherein said colorant is a colorant dye selected from the group consisting of: crystal violet, crystal violet lactone, basonyl blue, victoria pure blue BO, victoria blue B, blue colorant dye victoria blue FBR represented by the formula:

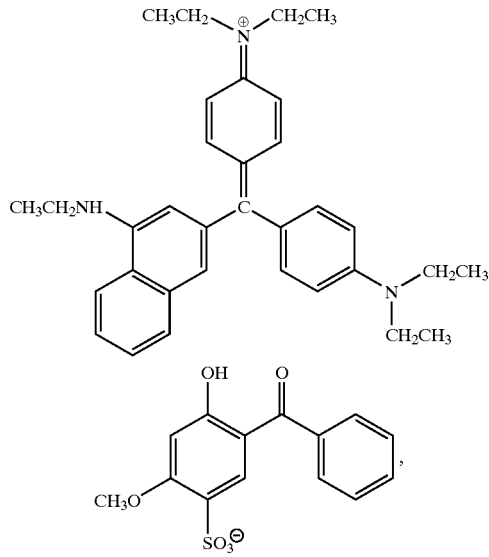

and a mixture thereof.

11. The imageable composition of claim 1, wherein said acid generator is a light sensitive triazine compound of the formula:

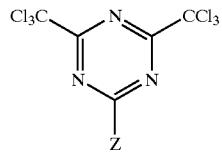

wherein Z selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester, cyano, a moiety of the formula:

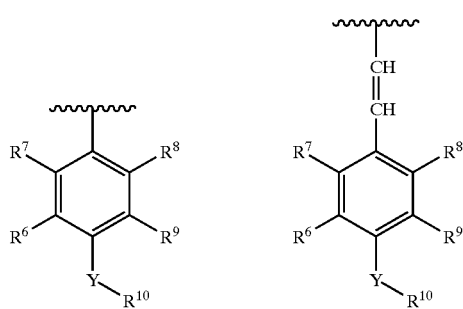

wherein
each of $R^6$, $R^7$, $R^8$ and $R^9$ is independently selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester and cyano, or $R^6$ and $R^7$ or $R^8$ and $R^9$ together with carbon atoms to which they are attached to form a cycloaliphatic, benzo or a substituted benzo ring;

$R^{10}$ is selected from the group consisting of: linear, branched or cyclic alkyl of 1 to 22 carbon atoms, aralkyl of 6 to 22 carbon atoms, aryl, alkaryl, haloalkyl, acyl, ester and cyano;

and Y is oxygen or sulfur.

12. The imageable composition of claim 1, wherein said acid generator is a light sensitive triazine compound of the formula:

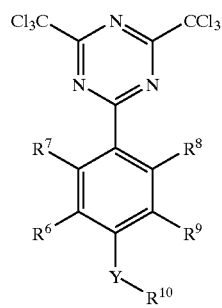

wherein
each of $R^6$, $R^7$, $R^8$ and $R^9$ is independently selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester and cyano, or $R^6$ and $R^7$ or $R^8$ and $R^9$ together with carbon atoms to which they are attached to form a cycloaliphatic, benzo or a substituted benzo ring;
$R^{10}$ is selected from the group consisting of: linear, branched or cyclic alkyl of 1 to 22 carbon atoms, aralkyl of 6 to 22 carbon atoms, aryl, alkaryl, haloalkyl, acyl, ester and cyano; and
Y is oxygen or sulfur.

13. The imageable composition of claim 1, wherein said acid generator is a light sensitive triazine compound selected from the group consisting of:

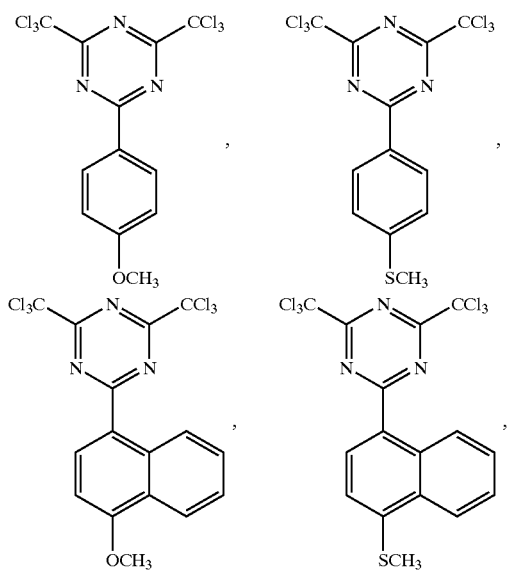

and a mixture thereof.

14. The imageable composition of claim 1, wherein said acid generator is selected from the group consisting of: an iodonium salt, a sulfonium salt, a hydrocarbyloxysulfonium salt, a hydrocarbyloxyammonium salt, an aryl diazonium salt and a combination thereof.

15. An imageable element comprising:
a lithographic substrate having a hydrophilic surface; and
a positive working imageable composition coated on the hydrophilic surface of said substrate, said composition comprising:
a hydroxyfunctional resin comprising a covalently bound radiation sensitive group capable of increasing the solubility of said imageable composition in an alkaline developer upon exposure to radiation; an acid generator; a colorant; and
an isocyanate crosslinking agent.

16. A method of producing an imaged element comprising the steps of:
providing an imageable element comprising a lithographic substrate having a hydrophilic surface and a positive working imageable composition coated on the hydrophilic surface of said substrate, wherein said imageable composition comprises:
a hydroxyfunctional resin comprising a covalently bound radiation sensitive group capable of increasing the solubility of said imageable composition in an alkaline developer upon exposure to radiation; an acid generator; a colorant; and
an isocyanate crosslinking agent;
heating said imageable element at a temperature and length of time sufficient to produce a crosslinked imageable element;
imagewise exposing said crosslinked imageable element to radiation to produce an imagewise exposed element having exposed and unexposed regions; and
removing the exposed regions of said imageable composition to produce said imaged element.

17. The method of claim 16, wherein said exposing step includes exposing said crosslinked imageable element to ultraviolet radiation.

18. The imageable composition of claim 1, wherein said acid generator is a salt including an anion derived from a non-volatile acid.

19. The imageable composition of claim 1, wherein said acid generator is a light sensitive triazine compound, an onium salt, a covalently bound sulfonate group-containing compound, a hydrocarbylsulfonamido-N-hydrocarbyl sulfonate, or a combination thereof.

20. The imageable composition of claim 1, wherein said acid generator is an onium salt including a non-nucleophilic anion.

21. The imageable composition of claim 1, wherein said acid generator is a monomeric or oligomeric aromatic diazonium salt.

22. The imageable element of claim 15, wherein said lithographic substrate is an aluminum sheet.

23. The imageable element of claim 15, wherein said covalently bound radiation sensitive group is sensitive to ultraviolet radiation.

24. The imageable element of claim 15, wherein said radiation sensitive group is a moiety selected from the group consisting of:

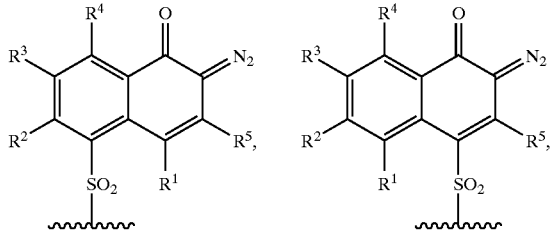

-continued

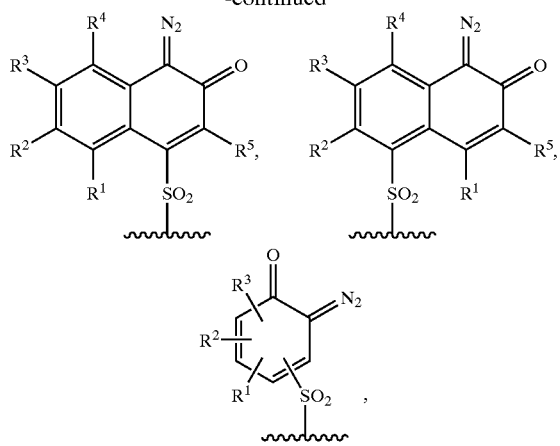

and a mixture thereof;
wherein each of $R^1$, $R^2$, $R^3$, $R^4$ and $R^5$ is independently selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester and cyano.

25. The imageable element of claim 15, wherein said radiation sensitive group is a moiety selected from:

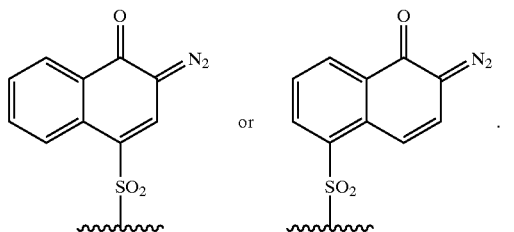

26. The imageable element of claim 15, wherein said hydroxyfunctional resin includes a resin moiety derived from a polyfunctional resin selected from the group consisting of: a novolak resin, a pyrogallol/acetone resin, polyvinyl phenol polymer, vinyl phenol/hydrocarbyl acrylate copolymer, a resole resin, an acrylic resin, a polyester resin, a polyurethane resin, a polyol and a mixture thereof.

27. The imageable element of claim 15, wherein said polyfunctional resin is a phenol novolak resin, a cresol novolak resin, a phenol/cresol novolak resin, a resole resin or a mixture thereof.

28. The imageable element of claim 15, wherein said isocyanate crosslinking agent is selected from the group consisting of: isophorone diisocyanate, methylene-bis-phenyl diisocyanate, toluene diisocyanate, hexamethylene diisocyanate, tetramethylxylylene diisocyanate, dimers thereof, adducts thereof with diols, adducts thereof with triols, adducts thereof with polyols, adducts thereof with polyesters, adducts thereof with acrylic resins, adducts thereof with polyurethane polyols, adducts thereof with an isocyanate blocking agent and mixtures thereof.

29. The imageable element of claim 15, wherein said isocyanate crosslinking agent comprises a blocking agent selected from the group consisting of: a phenol, an oxime, a lactam and a pyrazole.

30. The imageable element of claim 15, wherein said isocyanate crosslinking agent comprises a blocking agent selected from phenol, methyl ethyl ketone oxime, 2-pyrrolidone, 2-piperidone, caprolactam or 3,5-dimethylpyrazole.

31. The imageable element of claim 15, wherein said colorant is a colorant dye selected from the group consisting of: crystal violet, crystal violet lactone, basonyl blue, victoria pure blue BO, victoria blue B, blue colorant dye victoria blue FBR represented by the formula:

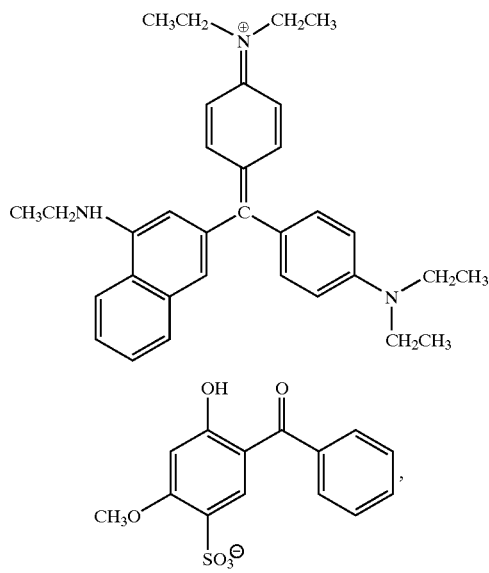

and a mixture thereof.

32. The imageable element of claim 15, wherein said acid generator is a salt including an anion derived from a non-volatile acid.

33. The imageable element of claim 15, wherein said acid generator is a light sensitive triazine compound, an onium salt, a covalently bound sulfonate group-containing compound, a hydrocarbylsulfonamido-N-hydrocarbyl sulfonate, or a combination thereof.

34. The imageable element of claim 15, wherein said acid generator is a light sensitive triazine compound of the formula:

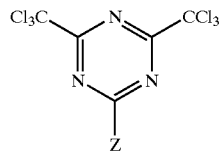

wherein Z selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester, cyano, a moiety of the formula:

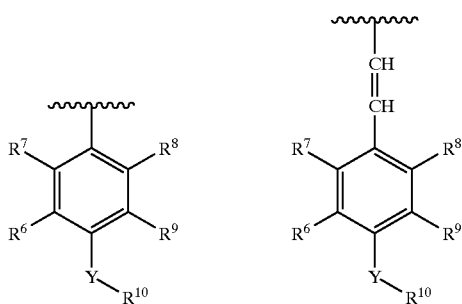

wherein
each of $R^6$, $R^7$, $R^8$ and $R^9$ is independently selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester and cyano, or $R^6$ and $R^7$ or $R^8$ and $R^9$ together with carbon atoms to which they are attached to form a cycloaliphatic, benzo or a substituted benzo ring;

$R^{10}$ is selected from the group consisting of: linear, branched or cyclic alkyl of 1 to 22 carbon atoms, aralkyl of 6 to 22 carbon atoms, aryl, alkaryl, haloalkyl, acyl, ester and cyano;

and Y is oxygen or sulfur.

35. The imageable element of claim 15, wherein said acid generator is a light sensitive triazine compound of the formula:

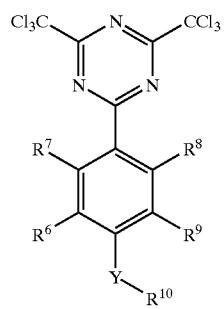

wherein
each of $R^6$, $R^7$, $R^8$ and $R^9$ is independently selected from the group consisting of: hydrogen, linear, branched or cyclic alkyl of 1 to 22 carbon atoms, aralkyl of 6 to 22 carbon atoms, aryl, alkaryl, alkoxy of 1 to 22 carbon atoms, haloalkyl, halogen, acyl, ester and cyano, or $R^6$ and $R^7$ or $R^8$ and $R^9$ together with carbon atoms to which they are attached to form a cycloaliphatic, benzo or a substituted benzo ring;

$R^{10}$ is selected from the group consisting of: linear, branched or cyclic alkyl of 1 to 22 carbon atoms, aralkyl of 6 to 22 carbon atoms, aryl, alkaryl, haloalkyl, acyl, ester and cyano; and Y is oxygen or sulfur.

36. The imageable element of claim 15, wherein said acid generator is a light sensitive triazine compound selected from the group consisting of:

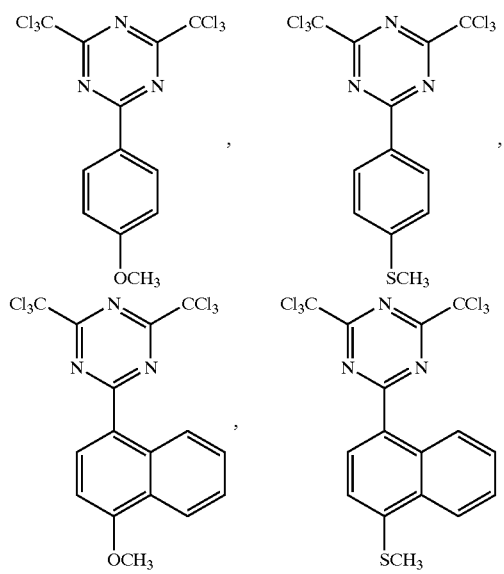

and a mixture thereof.

37. The imageable element of claim 15, wherein said acid generator is a monomeric or oligomeric aromatic diazonium salt.

38. The imageable element of claim 15, wherein said acid generator is selected from the group consisting of: an iodonium salt, a sulfonium salt, a hydrocarbyloxysulfonium salt, a hydrocarbyloxyammonium salt, an aryl diazonium salt and a combination thereof.

39. The imageable element of claim 15, wherein said acid generator is an onium salt including a non-nucleophilic anion.

40. The method of claim 35, wherein said lithographic substrate is an aluminum sheet.

* * * * *

UNITED STATES PATENT AND TRADEMARK OFFICE
CERTIFICATE OF CORRECTION

PATENT NO. : 6,783,911 B2 Page 1 of 1
DATED : August 31, 2004
INVENTOR(S) : James Laurence Mulligan It is certified that error appears in the above-identified patent and that said Letters Patent is hereby corrected as shown below:

<u>Column 28,</u>
Line 48, delete number "35" and replace it with -- 16 --.

Signed and Sealed this

Fifth Day of July, 2005

JON W. DUDAS
*Director of the United States Patent and Trademark Office*